(12) United States Patent
Yoshikawa et al.

(10) Patent No.: US 7,425,390 B2
(45) Date of Patent: Sep. 16, 2008

(54) PREPARATION OF HALFTONE PHASE SHIFT MASK BLANK

(75) Inventors: Hiroki Yoshikawa, Joetsu (JP); Satoshi Okazaki, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 627 days.

(21) Appl. No.: 11/059,529

(22) Filed: Feb. 17, 2005

(65) Prior Publication Data

US 2005/0186485 A1    Aug. 25, 2005

(30) Foreign Application Priority Data

Feb. 19, 2004    (JP)    ............... 2004-042990

(51) Int. Cl.
*G03F 1/00*    (2006.01)
(52) U.S. Cl. ............................................. 430/5
(58) Field of Classification Search ............. 430/5, 430/394; 204/192.2
See application file for complete search history.

(56) References Cited

U.S. PATENT DOCUMENTS 5,667,919 A * 9/1997 Tu et al. ................... 430/5
6,036,825 A * 3/2000 Umetsu et al. ........ 204/192.2
6,653,027 B2 * 11/2003 Angelopoulos et al. ...... 430/5

FOREIGN PATENT DOCUMENTS

JP    7-140635 A    6/1995

* cited by examiner

*Primary Examiner*—Stephen Rosasco
(74) *Attorney, Agent, or Firm*—Birch, Stewart, Kolasch & Birch, LLP

(57) ABSTRACT

In preparing a halftone phase shift mask blank, a metal and silicon-containing compound film serving as a halftone phase shift film is formed on a transparent substrate by a co-sputtering process including the steps of disposing a metal-containing target and a silicon target in a chamber, feeding sputtering gases into the chamber, and applying electric powers across both the targets at the same time. The sputtered region area of the metal-containing target is smaller than the sputtered region area of the silicon target.

9 Claims, 4 Drawing Sheets

PREPARATION OF HALFTONE PHASE SHIFT MASK BLANK

CROSS-REFERENCE TO RELATED APPLICATION

This non-provisional application claims priority under 35 U.S.C. §119(a) on Patent Application No. 2004-042990 filed in Japan on Feb. 19, 2004, the entire contents of which are hereby incorporated by reference.

TECHNICAL FIELD

This invention relates to a halftone phase shift mask blank and halftone phase shift mask for use in the fabrication of semiconductor integrated circuits or the like. More particularly, it relates to a method for preparing a halftone phase shift mask blank, a halftone phase shift mask blank prepared thereby, a halftone phase shift mask obtained therefrom, and a pattern transfer method using the same.

BACKGROUND ART

Photomasks are used in a wide variety of applications including the fabrication of semiconductor integrated circuits such as ICs, LSIs and VLSIs. Basically, the photomask is prepared from a photomask blank having a chromium based light-shielding film on a transparent substrate, by forming a predetermined pattern in the light-shielding film by photolithography using UV or electron beams. The current demand for a higher level of integration in the semiconductor integrated circuit market has created a need for a smaller pattern rule. The traditional solution is by reducing the wavelength of exposure light.

However, reducing the wavelength of exposure light improves resolution at the sacrifice of focal depth. This lowers the process stability and adversely affects the manufacture yield of products. One effective pattern transfer method for solving the problem is a phase shift method. A phase shift mask is used as a mask for transferring a micro-pattern.

Figure 9A:
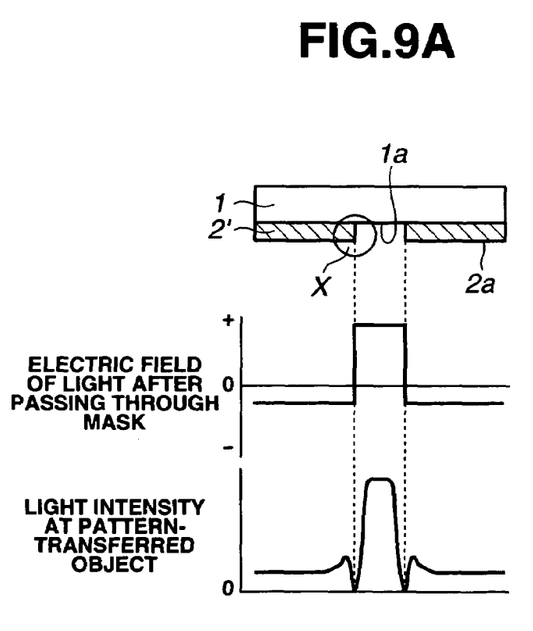
Figure 9B:
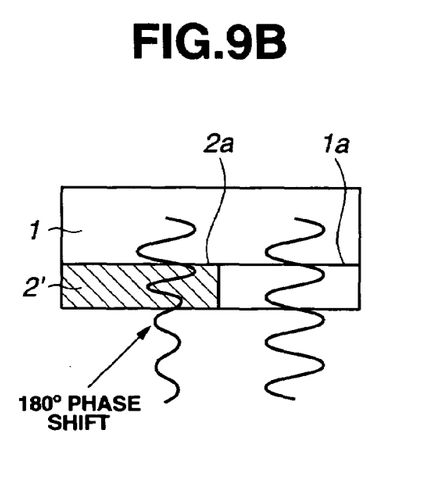
FIG. 9B is an enlarged view of region X in FIG. 9A.

Referring to FIGS. 9A and 9B, a phase shift mask, specifically a halftone phase shift mask is illustrated as comprising a substrate 1 and a phase shifter film 2' deposited thereon. The mask consists of a phase shifter 2a that forms a pattern on the substrate and an uncovered area 1a of the substrate 1 that is exposed where the phase shifter 2a is absent. A phase difference of about 180° is set between light transmitted by the uncovered substrate area 1a and light transmitted by the phase shifter 2a. Due to light interference at the pattern boundary, the light intensity at the interfering boundary becomes zero, improving the contrast of a transferred image. The phase shift method permits to increase the focal depth for acquiring the desired resolution. This achieves improvements in resolution and exposure process margin, as compared with conventional masks having ordinary light-shielding patterns in the form of chromium film.

Depending on the light transmission of phase shifter, the phase shift masks are generally divided for practical application into full transmission type phase shift masks and halftone type phase shift masks. The full transmission type phase shift masks are transparent to the exposure light wavelength because the light transmittance of the phase shifter section is equal to the light transmittance of uncovered substrate areas. In the halftone type phase shift masks, the light transmittance of the phase shifter section is several percents to several tens of percents of the light transmittance of uncovered substrate areas.

Figure 10:
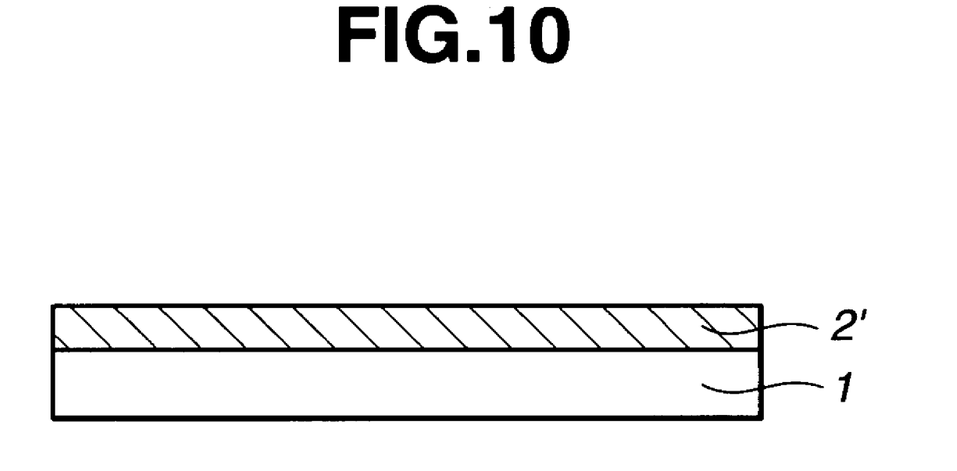
FIG. 10 is a sectional view of a basic phase shift mask blank.
Figure 11:
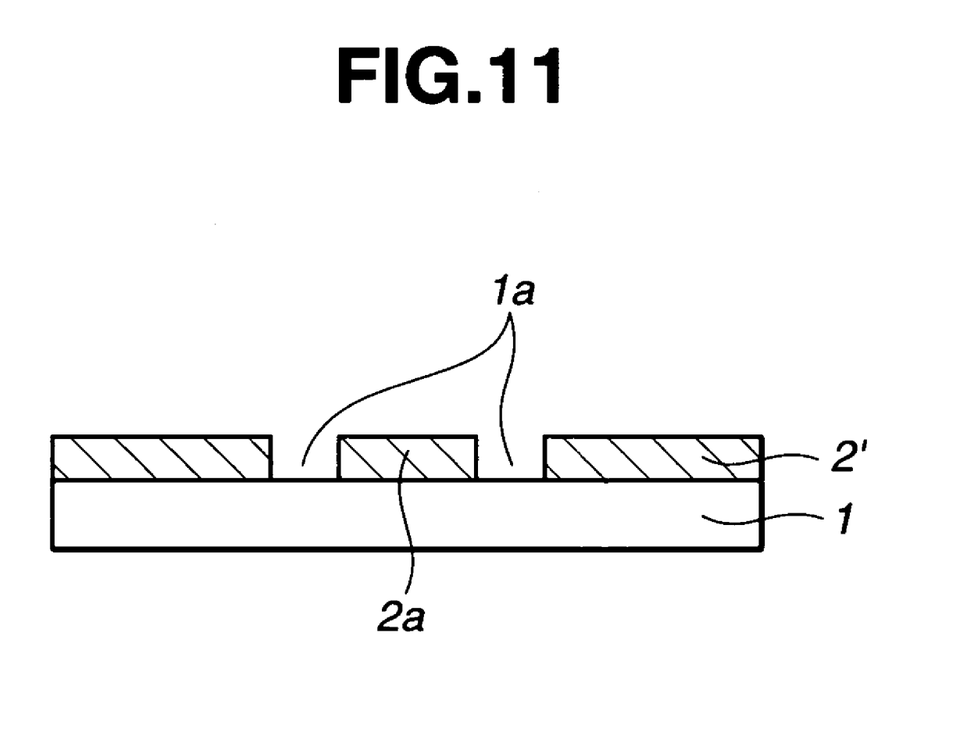
FIG. 11 is a sectional view of a basic phase shift mask made from the blank of FIG. 10.

FIGS. 10 and 11 illustrate the basic structure of a halftone type phase shift mask blank and a halftone type phase shift mask, respectively. The halftone type phase shift mask blank shown in FIG. 10 has a halftone phase shift film 2' formed over substantially the entire surface of a substrate 1. Patterning the phase shift film 2' results in the halftone type phase shift mask which is shown in FIG. 11 as comprising phase shifter sections 2a forming the pattern on the substrate 1 and uncovered areas 1a of the substrate where the phase shifter is absent. Light that passes the phase shifter section 2a is phase shifted relative to light that passes the uncovered substrate area 1a. The transmittance of the phase shifter section 2a is set to a light intensity that is insensitive to the resist on a wafer or article subject to pattern transfer. Accordingly, the phase shifter section 2a has a light-shielding function of substantially shielding exposure light.

The halftone phase shift masks include single-layer halftone phase shift masks featuring a simple structure and ease of manufacture. Some single-layer halftone phase shift masks known in the art have a phase shifter of MoSi base materials such as MoSiO and MoSiON as described in JP-A 7-140635.

As mentioned above, the halftone phase shift mask is an effective means for accomplishing a high resolution in a simple manner. For accomplishing a higher resolution, there exists a requirement to reduce the exposure wavelength from the current mainstream wavelength of 248 nm (KrF laser wavelength) to a shorter wavelength of 193 nm (ArF laser wavelength) or even 157 nm ($F_2$ laser wavelength). In order for a halftone phase shift mask to accommodate light exposure at such shorter wavelength, one common approach is to reduce the compositional ratio of metal (e.g., Mo) to silicon of which the halftone phase shift film is made.

To deposit a halftone phase shift film containing metal and silicon in such a lower metal/silicon ratio, a metal silicide target having a low metal content is generally sputtered in an atmosphere containing such gases as oxygen and nitrogen. Several problems arise with the metal silicide target having a low metal content.

The metal silicide target used in depositing a halftone phase shift film is typically a sintered target. In the sintering step involved in its manufacture process, the sintering temperature must be lowered because the metal silicide target having a lower metal/silicon ratio has a lower melting point. This fails to produce a target having a satisfactory sintered density. If a target having an unsatisfactory sintered density is used in the deposition of a halftone phase shift film, there can arise a problem that particles are released from the target during sputter deposition, resulting in increased film defects.

The method contemplated effective for avoiding such an increase of film defects by the particles from the target is a co-sputtering process in which a high density target consisting of metal and silicon in a high metal/silicon ratio (e.g., $MoSi_2$ target) is combined with a metal target or silicon target (e.g., single crystal silicon target). Both the targets used in this process have a sufficiently high density, and film defects due to the particles release from the target are suppressed to some extent.

In order for a halftone phase shift film to accommodate the above-discussed reduction of wavelength for light exposure, however, the halftone phase shift film containing metal and silicon must have a lower metal/silicon ratio than the prior art halftone phase shift films, typically less than 0.15 in molar ratio. In depositing a halftone phase shift film containing metal and silicon in such a lower metal/silicon ratio, the co-sputtering process encounters a problem that the sputtering power applied across the target having a high metal content (e.g., $MoSi_2$ target) largely differs from the sputtering power applied across the target having a low metal content (e.g., single crystal silicon target), that is, there is a significant difference in power density (W/cm$^2$) between these targets. Since it is impossible to apply powers to both the targets at optimum power densities, the composition within the halftone phase shift film being deposited becomes inconsistent, leading to large variations of transmittance. The electric discharge of sputtering also becomes unstable, sometimes resulting in even increased film defects.

SUMMARY OF THE INVENTION

Therefore, an object of the present invention is to provide a method for preparing a halftone phase shift mask blank of consistent quality which has a minimized variation of transmittance and less defects; a halftone phase shift mask blank; a halftone phase shift mask; and a pattern transfer method using the mask.

The present invention addresses a method for preparing a halftone phase shift mask blank, in which a halftone phase shift film containing at least one layer of metal and silicon-containing compound film is formed on a transparent substrate by a co-sputtering process including the steps of disposing (A) a metal-containing target and (B) a silicon target in a chamber, feeding a sputtering gas into the chamber, applying electric powers across the targets (A) and (B) at the same time to produce an electric discharge for sputtering. The inventor has discovered that when the area of the sputtered region of the metal-containing target (A) is smaller than the area of the sputtered region of the silicon target (B), a metal and silicon-containing compound film having a low metal content, especially suited for short wavelength light exposure, can be formed from the high density targets which will release few of the particles that can incur film defects. Since the area of the sputtered region of the metal-containing target is smaller, the sputtering power applied across the metal-containing target can be reduced without lowering the sputtering power density thereat. Then, even when a halftone phase shift film containing a metal and silicon in a low metal/silicon ratio is to be deposited, stable deposition by sputtering becomes possible. It is thus possible to prepare a halftone phase shift mask blank and a halftone phase shift mask of consistent quality which have a minimized variation of transmittance and less defects and which are especially suited for short wavelength light exposure. This halftone phase shift mask allows for pattern transfer to a photoresist through short wavelength light exposure. The invention is predicated on these findings.

In one aspect, the invention provides a method for preparing a halftone phase shift mask blank, comprising forming a halftone phase shift film containing at least one layer of metal and silicon-containing compound film on a transparent substrate by a co-sputtering process. The co-sputtering process includes the steps of disposing (A) at least one metal-containing target selected from a metal target and a target consisting of a metal and silicon and (B) a silicon target in a chamber, feeding a sputtering gas into the chamber, and applying electric powers across the targets (A) and (B) at the same time to produce an electric discharge for sputtering. The targets have respective regions to be sputtered, and the area of the sputtered region of the metal-containing target (A) is smaller than the area of the sputtered region of the silicon target (B).

In a preferred embodiment, the area of the sputtered region of the metal-containing target (A) is not more than one-half of the area of the sputtered region of the silicon target (B). In another preferred embodiment, the target consisting of a metal and silicon has a compositional ratio of metal to silicon of at least 0.25 on a molar basis. In a still further preferred embodiment, the metal and silicon-containing compound film contains the metal and silicon in a molar ratio of up to 0.2.

In another aspect, the invention provides a halftone phase shift mask blank prepared by the inventive method, wherein the metal and silicon-containing compound film contains the metal and silicon in a molar ratio of up to 0.2.

A halftone phase shift mask is obtained by patterning the halftone phase shift film in the halftone phase shift mask blank.

In a further aspect, the invention provides a pattern transfer method comprising subjecting a photoresist to patterned light exposure using the halftone phase shift mask.

The present invention enables to deposit a film containing a metal and silicon in a low metal/silicon ratio at a consistent level of quality without lowering the sputtering power density at the metal-containing target and while restraining particles from being released from the targets. There are thus provided a halftone phase shift mask blank and a halftone phase shift mask of consistent quality which are especially suited for short wavelength light exposure.

BRIEF DESCRIPTION OF THE DRAWINGS

The above and other features and advantages of the invention will be more fully understood by reading the following description, taken in conjunction with the accompanying drawings.

FIG. 6 illustrates in sectional view the method of manufacturing halftone phase shift masks according to the invention.

FIGS. 9A and 9B illustrate the operating principle of a halftone phase shift mask.

DESCRIPTION OF THE PREFERRED EMBODIMENT

According to the present invention, a halftone phase shift mask blank is prepared by a co-sputtering process including the steps of disposing (A) at least one metal-containing target selected from a metal target and a target consisting of a metal and silicon and (B) a silicon target in a chamber, the area of the sputtered region of the metal-containing target (A) being smaller than the area of the sputtered region of the silicon target (B), feeding a sputtering gas into the chamber, applying electric powers across the targets (A) and (B) at the same time to produce an electric discharge for sputtering. In this way, a halftone phase shift film containing at least one layer of metal and silicon-containing compound film is formed on a transparent substrate.

In the method of preparing a halftone phase shift mask blank according to the invention, a silicon target and a metal-containing target having a smaller area of sputtered region than the silicon target are used. Then, even when the sputtering power to the metal-containing target is reduced, the sputtering power density (sputtering power applied per unit sputtering area) on the metal-containing target can be appropriate to the sputtering power density on the silicon target, which creates a stable sputtering discharge. This results in a halftone phase shift film of consistent quality which has a minimized variation of transmittance and less defects. That is, the halftone phase shift mask blank obtained is especially suited for short wavelength light exposure. In a preferred embodiment, the area of the sputtered region of the metal-containing target (A) is equal to or smaller than one-half (½) of the area of the sputtered region of the silicon target (B). Specifically, in the case of cylindrical targets having a circular region to be sputtered for the deposition of a compound film, any suitable area ratio can be set by reducing the diameter of the metal-containing target to be smaller than the diameter of the silicon target.

The method of the invention is especially suited for the preparation of a halftone phase shift mask blank having a halftone phase shift film in the form of a metal and silicon-containing compound film in which the content ratio of metal to silicon is up to 0.2, preferably up to 0.15, more preferably up to 0.1, and even more preferably up to 0.07, on a molar basis. The lower limit of the content ratio of metal to silicon is the limit above which a film functioning as a halftone phase shift film at the exposure wavelength is available, and typically at least 0.02 on a molar basis.

The metal component of the metal-containing target may be any element selected from transition metals, lanthanoids and combinations thereof. Of these, Mo, Zr, Ta, Cr and Hf are preferred, with Mo and Zr being most preferred. Suitable metal targets include molybdenum targets, zirconium targets, and molybdenum-zirconium targets. Suitable targets consisting of a metal(s) and silicon include targets consisting of molybdenum and silicon such as molybdenum silicide, targets consisting of zirconium and silicon such as zirconium silicide, and targets consisting of molybdenum, zirconium and silicon such as molybdenum zirconium silicide.

As the metal-containing target, at least one target is selected from metal targets and targets consisting of metal and silicon, depending on the desired composition of a compound film to be deposited. For the targets consisting of metal and silicon, the compositional ratio of metal to silicon is preferably at least 0.25, more preferably at least 0.3, and most preferably at least 0.5, on a molar basis.

In the method of the invention, the metal-containing target and a silicon target, typically a single crystal silicon target are disposed in a chamber. As the sputtering gas, an inert gas such as neon, argon or krypton and typically a mixture of an inert gas and at least one reactive gas selected from oxygen-containing gases, nitrogen-containing gases and carbon-containing gases is fed to the chamber. Electric powers are applied across both the targets at the same time to produce an electric discharge of sputtering. By this co-sputtering process, a metal and silicon-containing compound film serving as a halftone phase shift film is formed on a transparent substrate. When the reactive gas is used along with the inert gas, the process is reactive co-sputtering.

The transparent substrate is made of quartz, $CaF_2$ or a material that is transparent to the exposure light. The oxygen-containing gas includes $CO_2$, NO, $O_2$, etc.; the nitrogen-containing gas includes NO, $NO_2$, $N_2$, etc.; and the carbon-containing gas includes $CH_4$, $CO_2$, CO, etc. A proper choice may be made among these gases in accordance with the desired composition of a compound film to be deposited. The sputtering system used herein may be DC sputtering, magnetron sputtering or the like. It is preferred that the transparent substrate be rotated about its axis perpendicular to its surface (to receive a deposit) faced toward the targets during the sputtering process.

In the method of the invention, the powers applied across the respective targets may be determined as appropriate. Preferably powers are applied such that the ratio of the power density on the metal-containing target to the power density on the silicon target is from 0.15 to 5, more preferably from 0.3 to 3. For each target, the power density is preferably in the range of about 0.5 to about 8.0 W/cm².

By the preparation method described above, a halftone phase shift mask blank is prepared. The halftone phase shift mask blank may be such that one layer of halftone phase shift film is formed on a transparent substrate as a metal and silicon-containing compound film. The preferred halftone phase shift mask blank is the one shown in FIG. 1 in which a halftone phase shift film 2 consisting of two layers: a light absorption function film 21 having a light absorbing function and a phase shift function film 22 having a phase shift function and a weak light absorbing function is formed on a transparent substrate 1.

Figure 1:
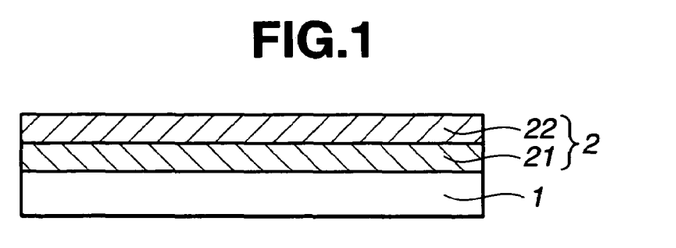
FIG. 1 illustrates a sectional view of a halftone phase shift mask blank in one embodiment of the invention.

The light absorption function film 21 is a metal and silicon-containing compound film, preferably a film formed of an oxide, nitride, carbide, oxynitride, oxynitride carbide or nitride carbide comprising a metal and silicon. More preferred is an unsaturated metal compound film that is a film of metal-rich composition wherein the contents of oxygen, nitrogen and carbon are less than the stoichiometry. A film consisting essentially of a metal and silicon is also acceptable.

The metal of which the light absorption function film is constructed may be any element selected from transition metals, lanthanoids and combinations thereof. Of these, Mo, Zr, Ta, Cr and Hf are preferred, with Mo and Zr being most preferred.

As used herein, the "stoichiometry" refers to a compound in which constituent elements assume typical valence numbers so as to provide an exact balance of electric charges. The metal compound having elements in such a constitution ratio is referred to as "saturated metal compound." Of exemplary metals, Mo is hexa-valent (6+), Zr is tetra-valent (430 ), Ta is penta-valent (5+), Cr is tri-valent (3+), Hf is tetra-valent (4+), and silicon (Si) is tetra-valent (4+). Of light elements, oxygen (O) is di-valent (2−), nitrogen (N) is tri-valent (3−), and carbon is tetra-valent (4−). Specifically, in the case of an oxide containing molybdenum and silicon in a ratio of 1:2, the stoichiometric composition is $MoSi_2O_7$; and in the case of a nitride containing molybdenum and silicon in a ratio of 1:1, the stoichiometric composition is $MoSiN_{10/3}$.

By contrast, a metal compound in which the contents of light elements, i.e., oxygen, nitrogen and carbon are lower than the stoichiometry so that the apparent electric charge balance determined by the valence numbers is thrown off is referred to as "unsaturated metal compound." Specifically, in the case of oxides containing molybdenum and silicon in a ratio of 1:2, those compounds having the average composition: $MoSi_2O_{7-a}$ wherein a is a positive number of 0<a<7 are unsaturated metal compounds; and in the case of nitrides containing molybdenum and silicon in a ratio of 1:1, those compounds having the average composition: $MoSiN_{(10/3)-b}$ wherein b is a positive number of 0<b<10/3 are unsaturated metal compounds.

Although the reduced content of light element tips the apparent electric charge balance as mentioned above, a balance of electric charges is actually kept by virtue of generation of positive electric charges like holes and a change of metal valence number (e.g., the valence number of Mo changes from hexa-valence (6+) to tri-valence (3+)).

Preferred examples of the unsaturated metal compound of which the light absorption function film is formed include unsaturated metal silicide oxides, unsaturated metal silicide oxynitrides, and unsaturated metal silicide oxynitride carbides. As to their composition, preferably the metal silicide oxides (MSiO wherein M is metal) consist essentially of 0.2 to 80 at % of M, 19 to 90 at % of Si and 0.1 to 60 at % of O; the metal silicide oxynitrides (MSiON wherein M is metal) consist essentially of 0.2 to 80 at % of M, 19 to 90 at % of Si, 0.1 to 50 at % of O and 0.1 to 50 at % of N; and the metal silicide oxynitride carbides (MSiONC wherein M is metal) consist essentially of 0.2 to 80 at % of M, 19 to 90 at % of Si, 0.1 to 45 at % of O, 0.1 to 45 at % of N and 0.1 to 30 at % of C.

On the other hand, the phase shift function film 22 is a metal and silicon-containing compound film and preferably a film formed of an oxide, nitride, carbide, oxynitride, oxynitride carbide or nitride carbide comprising a metal and silicon. Preferred are saturated metal compounds of the composition having stoichiometric contents of oxygen, nitrogen and carbon. A phase shift function film formed of a saturated metal compound adds the advantage of chemical resistance to the halftone phase shift film. In the embodiment wherein the phase shift film consists of two layers of a light absorption function film and a phase shift function film, the phase shift function film should preferably satisfy that the content ratio of metal to silicon be up to 0.2, more preferably up to 0.15, even more preferably up to 0.1, and most preferably up to 0.07, on a molar basis. Then, the phase shift film can clear commonly required parameters, a transmittance of 4% to 35% and a phase difference of 170° to 185° even when used with short wavelength light equal to or less than 193 nm.

The metal of which the phase shift function film is constructed may be any element selected from among transition metals, lanthanoids and combinations thereof. Of these, Mo, Zr, Ta, Cr and Hf are preferred, with Mo and Zr being most preferred.

The phase shift function film is preferably formed of metal silicide oxides, metal silicide oxynitrides, or metal silicide oxynitride carbides. As to their composition, it is recommended that the metal silicide oxides (MSiO wherein M is metal) consist essentially of 0.1 to 10 at %, preferably 0.3 to 7 at % of M, 10 to 42 at %, preferably 30 to 42 at % of Si and 30 to 60 at % of O; the metal silicide oxynitrides (MSiON wherein M is metal) consist essentially of 0.1 to 10 at %, preferably 0.3 to 7 at % of M, 10 to 57 at %, preferably 30 to 52 at % of Si, 30 to 60 at % of O and 5 to 57 at % of N; and the metal silicide oxynitride carbides (MSiONC wherein M is metal) consist essentially of 0.1 to 10 at %, preferably 0.3 to 7 at % of M, 10 to 57 at %, preferably 30 to 52 at % of Si, 30 to 55 at % of O, 5 to 50 at % of N and 0.1 to 10 at % of C.

According to the invention, the light absorption function film and the phase shift function film are constructed as mentioned above, and the light absorption function film has a thickness of up to 15 nm, preferably up to 10 nm, more preferably up to 6 nm, even more preferably up to 2.5 nm, and most preferably up to 1.25 nm. Although the halftone phase shift film is a multilayer film having two stacked layers of light absorption function film and phase shift function film, the controlled thickness of the light absorption function film ensures that the two layers can be processed with a single dry etching gas, especially fluoride gas because they can be etched at rates whose difference is not substantially problematic.

When the halftone phase shift film is constructed by two layers of light absorption function film and phase shift function film, the resulting halftone phase shift mask blank is best suited as halftone phase shift masks for $F_2$ laser and halftone phase shift masks with a high transmittance, especially a transmittance of at least 15%, for ArF laser.

Figure 2:
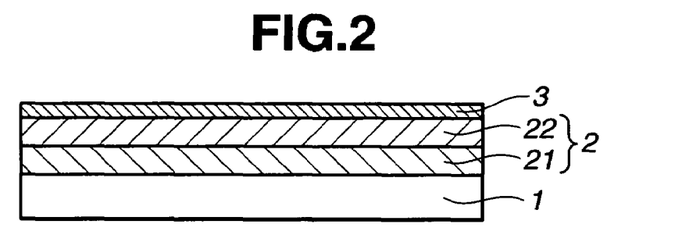
FIG. 2 is a sectional view of a phase shift mask blank having a chromium-based light-shielding film.
Figure 3:
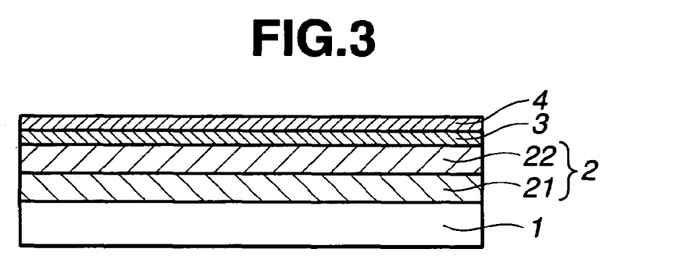
FIG. 3 is a sectional view of a phase shift mask blank having a chromium-based light-shielding film and a chromium-based antireflection film.
Figure 4:
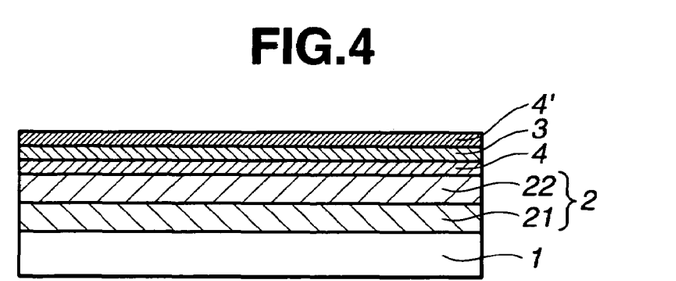
FIG. 4 is a sectional view of a phase shift mask blank having a chromium-based light-shielding film and chromium-based antireflection films.

In preferred embodiments of the invention, a chromium based light-shielding film or a chromium based antireflective film or both are formed on the halftone phase shift film. In one preferred embodiment, as shown in FIG. 2, the phase shift mask blank further includes a chromium-based light-shielding film 3 on the halftone phase shift film 2. In a further preferred embodiment, as shown in FIG. 3, the phase shift mask blank further includes a chromium-based antireflection film 4 formed on the chromium-based light-shielding film 3 for reducing reflection from the light-shielding film 3. In a still further preferred embodiment, as shown in FIG. 4, the phase shift mask blank includes a halftone phase shift film 2, a first chromium-based antireflection film 4, a chromium-based light-shielding film 3, and a second chromium-based antireflection film 4' formed on a transparent substrate 1 in the described order. It is noted in FIGS. 2 to 4 that the halftone phase shift film 2 consists of a light absorption function film 21 and a phase shift function film 22.

The chromium-based light-shielding film or chromium-based antireflection film is preferably made of chromium oxycarbide (CrOC), chromium oxynitride carbide (CrONC) or a multilayer combination of both.

The chromium-based light-shielding film or chromium-based antireflection film can be formed by reactive sputtering. Specifically, the target is neat chromium or chromium having added thereto oxygen, nitrogen, carbon or a combination thereof. The sputtering gas is an inert gas such as neon, argon or krypton to which carbon dioxide gas is added as a carbon source.

For example, sputtering gases which may be used to form a CrONC film include a gas mixture composed of at least one each of a carbon-containing gas (e.g., $CH_4$, $Co_2$, CO), a nitrogen-containing gas (e.g., NO, $NO_2$, $N_2$) and an oxygen-containing gas (e.g., $CO_2$, NO, $O_2$), or any such gas mixture in combination with an inert gas such as argon, neon or krypton. Using $CO_2$ gas or CO gas as both the carbon and oxygen sources is especially advantageous for uniformity in the plane of the substrate and for controllability during production. Each of the sputtering gases may be separately fed into the sputtering chamber, or some or all of the gases may first be mixed together then fed into the chamber.

Preferably the CrOC film consists essentially of 20 to 95 at %, especially 30 to 85 at % of Cr, 1 to 30 at %, especially 5 to 20 at % of C, and 1 to 60 at %, especially 5 to 50 at % of O; and the CrONC film consists essentially of 20 to 95 at %, especially 30 to 80 at % of Cr, 1 to 20 at %, especially 2 to 15 at % of C, 1 to 60 at %, especially 5 to 50 at % of O, and 1 to 30 at %, especially 3 to 20 at % of N.

Figure 5:
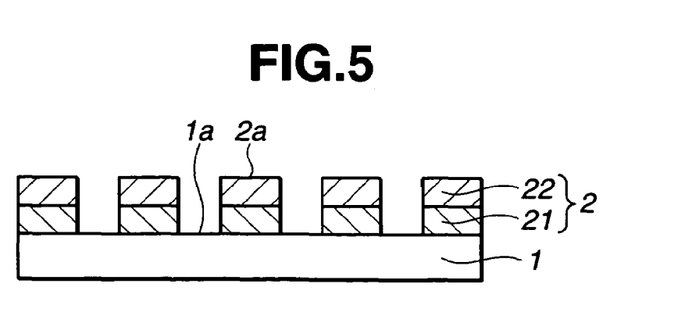
FIG. 5 is a sectional view of a halftone phase shift mask in one embodiment of the invention.
Figure 6A:
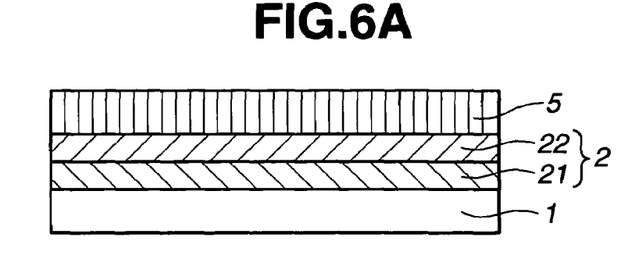
FIG. 6A shows the mask blank on which a resist film has been formed.
Figure 6B:
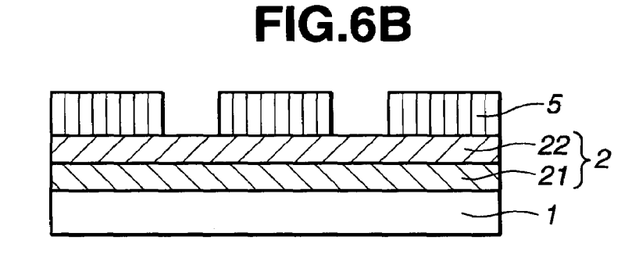
FIG. 6B shows the structure after the resist film has been patterned.
Figure 6C:
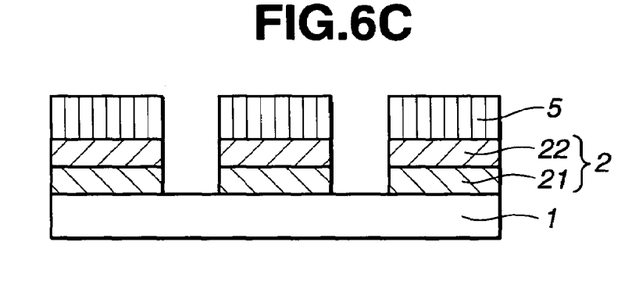
FIG. 6C shows the structure after etching.
Figure 6D:
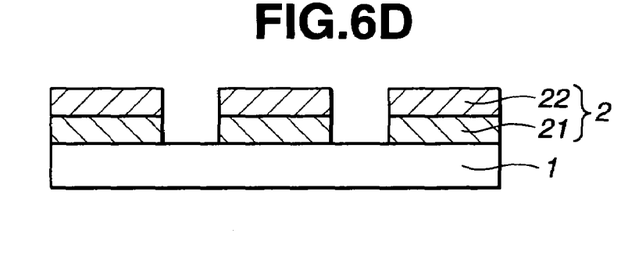
FIG. 6D shows the structure after the resist film has been removed.

The halftone phase shift mask of the invention is manufactured by patterning the phase shift film on the halftone phase shift mask blank as described above. More specifically, by patterning the halftone phase shift film 2 on the halftone phase shift mask blank shown in FIG. 1, a halftone phase shift mask as shown in FIG. 5 is manufactured. The halftone phase shift mask includes patterned phase shifter sections 2a and uncovered substrate areas 1a therebetween.

The halftone phase shift mask of the structure shown in FIG. 5 may be manufactured by a process as shown in FIG. 6. After a halftone phase shift film 2 is formed on a substrate 1 by the process described above, a resist film 5 is formed on the film 2 (FIG. 6A). The resist film 5 is lithographically patterned (FIG. 6B), after which the phase shift film 2 is etched (FIG. 6C), and the resist film 5 is subsequently stripped (FIG. 6D). In this process, application of the resist film, patterning (exposure and development), etching, and removal of the resist film may be carried out by known methods.

Figure 7:
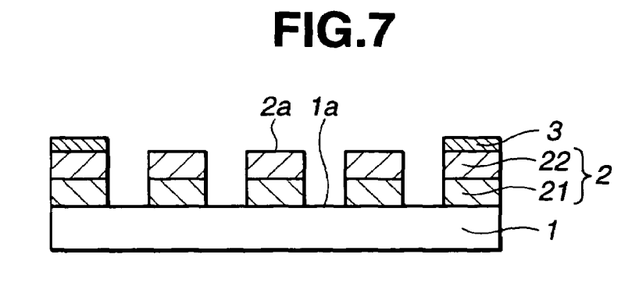
FIG. 7 is a sectional view showing a halftone phase shift mask in another embodiment of the invention.

In cases where a Cr-based film (e.g., chromium-based light-shielding film and/or chromium-based antireflection film) is formed on the halftone phase shift film, a halftone phase shift mask on which the Cr-based film (chromium-based light-shielding film 3) remains at the peripheral edges of the substrate 1 (see FIG. 7) can be produced by etching away the Cr-based film 3 in the regions that are to be subject to light exposure, thereby leaving the surface of the phase shift film 2 exposed, then patterning the phase shift film 2 into sections 2a as described above. Alternatively, a halftone phase shift mask can be produced by applying a resist to the Cr-based film 3 and patterning the resist, then etching the Cr-based film 3 and the phase shift film 2 for patterning. Only the regions of the Cr-based film 3 that are to be subject to light exposure are then removed by selective etching so as to leave the phase shift pattern exposed at the surface. It is noted in FIGS. 5 to 7 that the halftone phase shift film 2 consists of a light absorption function film 21 and a phase shift function film 22.

EXAMPLE

Examples and Comparative Examples are given below for illustrating the invention although the invention is not limited thereto.

Figure 8:
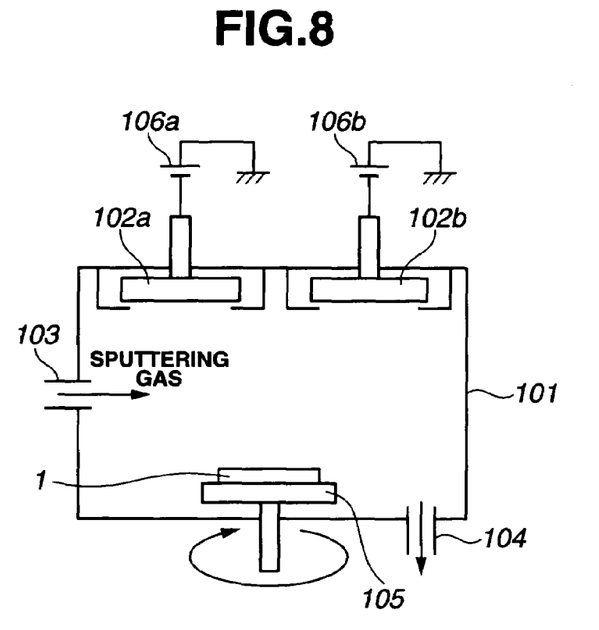
FIG. 8 is a schematic view of the d.c. sputtering system used in Examples and Comparative Examples.

In Examples, halftone phase shift mask blanks as shown in FIG. 1 were prepared in which a halftone phase shift film 2 consisting of two layers, a light absorption function film 21 and a phase shift function film 22 was deposited on a transparent substrate. For the deposition, a DC sputtering system including two targets as shown in FIG. 8 was used. The system of FIG. 8 includes a chamber 101 in which a substrate 1 is rested on a rotating support 105, and two targets 102a and 102b (one is a dummy in Comparative Example 2) are situated and electrically coupled to power supplies 106a and 106b, respectively. The chamber 101 is provided with a sputtering gas inlet 103 and a gas outlet 104. All the gas flow rates are measured at 0° C. and 1013 hPa (one atmosphere).

Example 1

The sputtering targets used were a sintered $MoSi_2$ target having a sputter region with an area of 150 $cm^2$ and a single crystal Si target having a sputter region with an area of 310 $cm^2$.

First, a light absorption function film was deposited on a quartz substrate. As the sputtering gas, Ar, $N_2$ and $O_2$ gases were fed to the chamber at a flow rate of 20 $cm^3$/min, 10 $cm^3$/min and 4 $cm^3$/min, respectively. During the gas feed, a gas pressure of 0.10 Pa was set in the sputtering chamber. By applying a sputtering power of 200 W across the sintered $MoSi_2$ target and a sputtering power of 1300 W across the single crystal Si target for co-sputtering and rotating the substrate at 30 rpm, a light absorption function film (MoSiON film) was deposited to a thickness of 5.0 nm. The MoSiON film had the composition: 7 at % Mo, 52 at % Si, 20 at % O, and 21 at % N.

Next, a phase shift function film was deposited. Deposition was performed under the same conditions as used for the light absorption function film except that the power applied across the sintered $MoSi_2$ target was 100 W, and the flow rates of sputtering gases were 5 $cm^3$/min of Ar, 50 $cm^3$/min of $N_2$ and 3 $cm^3$/min of $O_2$. A phase shift function film (MoSiON film) was deposited on the light absorption function film to a thickness of 70.0 nm. The MoSiON film had the composition: 3 at % Mo, 42 at % Si, 38 at % O, and 17 at % N. The light absorption function film and the phase shift function film were deposited so as to form a halftone phase shift film exhibiting a phase difference of 180° and a transmittance of 6% at wavelength 157 nm.

The halftone phase shift mask blank thus obtained was evaluated for the variation of transmittance and the number of defects by the following tests. As a result, the variation of transmittance was ±0.06% and the number of defects was 10.3 defects/sample.

Variation of Transmittance

Ten samples at the center of their film were measured for transmittance at wavelength 157 nm. A variation among the samples was determined.

Number of Defects

On ten samples, the number of defects with a size of 0.2 μm or larger was counted using a tester GM-1000 by Hitachi Electronic Engineering Co., Ltd. An average number was determined therefrom.

Example 2

The sputtering targets used were a metal Mo target having a sputter region with an area of 50 $cm^2$ and a single crystal Si target having a sputter region with an area of 310 $cm^2$.

First, a light absorption function film was deposited on a quartz substrate. As the sputtering gas, Ar, $N_2$ and $O_2$ gases were fed to the chamber at a flow rate of 20 $cm^3$/min, 10 $cm^3$/min and 4 $cm^3$/min, respectively. During the gas feed, a gas pressure of 0.10 Pa was set in the sputtering chamber. By applying a sputtering power of 70 W across the Mo target and a sputtering power of 1300 W across the single crystal Si target for co-sputtering and rotating the substrate at 30 rpm, a light absorption function film (MoSiON film) was deposited to a thickness of 5.0 nm. The MoSiON film had the composition: 7 at % Mo, 52 at % Si, 20 at % O, and 21 at % N.

Next, a phase shift function film was deposited. Deposition was performed under the same conditions as used for the light absorption function film except that the power applied across the Mo target was 33 W, and the flow rates of sputtering gases were 5 $cm^3$/min of Ar, 50 $cm^3$/min of $N_2$ and 3 $cm^3$/min of $O_2$, A phase shift function film (MoSiON film) was deposited on the light absorption function film to a thickness of 70.0 nm. The MoSiON film had the composition: 3 at % Mo, 42 at % Si, 38 at % O, and 17 at % N. The light absorption function film and the phase shift function film were deposited so as to form a halftone phase shift film exhibiting a phase difference of 180° and a transmittance of 6% at wavelength 157 nm.

The halftone phase shift mask blank thus obtained was evaluated for the variation of transmittance and the number of defects by the above tests. As a result, the variation of transmittance was ±0.05% and the number of defects was 8.2 defects/sample.

Comparative Example 1

The sputtering targets used were a metal Mo target having a sputter region with an area of 310 cm$^2$ and a single crystal Si target having a sputter region with an area of 310 cm$^2$.

First, a light absorption function film was deposited on a quartz substrate. As the sputtering gas, Ar, N$_2$ and O$_2$ gases were fed to the chamber at a flow rate of 20 cm$^3$/min, 10 cm$^3$/min and 4 cm$^3$/min, respectively. During the gas feed, a gas pressure of 0.10 Pa was set in the sputtering chamber. By applying a sputtering power of 70 W across the Mo target and a sputtering power of 1300 W across the single crystal Si target for co-sputtering and rotating the substrate at 30 rpm, a light absorption function film (MoSiON film) was deposited to a thickness of 5.0 nm. The MoSiON film had the composition: 7 at % Mo, 52 at % Si, 20 at % O, and 21 at % N.

Next, a phase shift function film was deposited. Deposition was performed under the same conditions as used for the light absorption function film except that the power applied across the Mo target was 33 W, and the flow rates of sputtering gases were 5 cm$^3$/min of Ar, 50 cm$^3$/min of N$_2$ and 3 cm$^3$/min of O$_2$. A phase shift function film (MoSiON film) was deposited on the light absorption function film to a thickness of 70.0 nm. The MoSiON film had the composition: 3 at % Mo, 42 at % Si, 38 at % O, and 17 at % N. The light absorption function film and the phase shift function film were deposited so as to form a halftone phase shift film exhibiting a phase difference of 180° and a transmittance of 6% at wavelength 157 nm.

The halftone phase shift mask blank thus obtained was evaluated for the variation of transmittance and the number of defects by the above tests. As a result, the variation of transmittance was ±0.82% and the number of defects was 18.6 defects/sample.

Comparative Example 2

The sputtering target used was a sintered MoSi$_{9.5}$ target having a sputter region with an area of 310 cm$^2$. Instead of the other target, a dummy plate which had been blast treated so that a film deposited thereon might not spall off was used. Sputtering was thus carried out with a single target (MoSi$_{9.5}$ sintered body).

First, a light absorption function film was deposited on a quartz substrate. As the sputtering gas, Ar, N$_2$ and O$_2$ gases were fed to the chamber at a flow rate of 20 cm$^3$/min, 10 cm$^3$/min and 4 cm$^3$/min, respectively. During the gas feed, a gas pressure of 0.10 Pa was set in the sputtering chamber. By applying a sputtering power of 1300 W across the sintered MoSi$_{9.5}$ target and rotating the substrate at 30 rpm, a light absorption function film (MoSiON film) was deposited to a thickness of 5.0 nm. The MoSiON film had the composition: 6 at % Mo, 51 at % Si, 20 at % O, and 23 at % N.

Next, a phase shift function film was deposited. Deposition was performed under the same conditions as used for the light absorption function film except that the flow rates of sputtering gases were 5 cm$^3$/min of Ar, 50 cm$^3$/min of N$_2$ and 3 cm$^3$/min of O$_2$. A phase shift function film (MoSiON film) was deposited on the light absorption function film to a thickness of 70.0 nm. The MoSiON film had the composition: 5 at % Mo, 42 at % Si, 37 at % O, and 16 at % N. The light absorption function film and the phase shift function film were deposited so as to form a halftone phase shift film exhibiting a phase difference of 180° and a transmittance of 6% at wavelength 157 nm.

The halftone phase shift mask blank thus obtained was evaluated for the variation of transmittance and the number of defects by the above tests. As a result, the variation of transmittance was ±0.07% and the number of defects was 28.7 defects/sample.

It is demonstrated that in Examples 1 and 2 wherein the area of the sputtered region of the metal-containing target is smaller than the area of the sputtered region of the silicon target, there are obtained halftone phase shift films having a minimized variation of transmittance and less defects. In contrast, Comparative Example 1 wherein the area of the sputtered region of the metal-containing target is equal to the area of the sputtered region of the silicon target shows a noticeable variation of transmittance. Comparative Example 2 using only a target having a low metal/silicon ratio shows an increased number of defects.

Japanese Patent Application No. 2004-042990 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for preparing a halftone phase shift mask blank, comprising forming a halftone phase shift film containing at least one layer of metal and silicon-containing compound film on a transparent substrate by a co-sputtering process, said co-sputtering process including the steps of disposing (A) at least one metal-containing target selected from a metal target and a target consisting of a metal and silicon and (B) a silicon target in a chamber, feeding a sputtering gas into the chamber, and applying electric powers across the targets (A) and (B) at the same time to produce an electric discharge for sputtering, the targets having respective electric discharge regions to be sputtered, the area of the sputtered region of the metal-containing target (A) being smaller than the area of the sputtered region of the silicon target (B).

2. The method of claim 1, wherein the area of the sputtered region of the metal-containing target (A) is not more than one-half of the area of the sputtered region of the silicon target (B).

3. The method of claim 1, wherein the target consisting of a metal and silicon has a compositional ratio of metal to silicon of at least 0.25 on a molar basis.

4. The method of claim 1, wherein the metal and silicon-containing compound film contains the metal and silicon in a molar ratio of up to 0.2.

5. A halftone phase shift mask blank prepared by the method of claim 1, wherein the metal and silicon-containing compound film contains the metal and silicon in a molar ratio of up to 0.2.

6. A halftone phase shift mask obtained by patterning the halftone phase shift film in the halftone phase shift mask blank of claim 5.

7. A pattern transfer method comprising subjecting a photoresist to patterned light exposure using the halftone phase shift mask of claim 6.

8. The method of claim 1, wherein a ratio of power density on the metal-containing target (A) to power density on the silicon target (B) is from 0.15 to 5.

9. The method of claim 1, wherein power density is applied in the range of 0.5 to 8.0 W/cm$^2$ for each target.

* * * * *